United States Patent [19]

Ashcraft

[11] Patent Number: 4,693,959
[45] Date of Patent: Sep. 15, 1987

[54] ADHESION PROMOTION IN PHOTORESIST LAMINATION AND PROCESSING

[75] Inventor: Robert W. Ashcraft, Towanda, Pa.

[73] Assignee: E.I. Du Pont de Nemours and Company, Wilmington, Del.

[21] Appl. No.: 837,389

[22] Filed: Mar. 7, 1986

[51] Int. Cl.$^4$ ............................................. G03C 5/00
[52] U.S. Cl. .................................... 430/323; 430/324; 430/325; 430/327; 430/329; 430/281
[58] Field of Search ............... 430/313, 323, 324, 327, 430/329, 281, 954

[56] References Cited

U.S. PATENT DOCUMENTS

| | | | |
|---|---|---|---|
| 3,469,982 | 9/1969 | Celeste | 430/324 |
| 3,622,234 | 11/1971 | Seybolt et al. | 75/170 |
| 3,645,722 | 2/1972 | Aulenbach et al. | 75/124 |
| 4,056,453 | 11/1977 | Barzynski et al. | 204/159.23 |
| 4,293,635 | 10/1981 | Flint et al. | 430/271 |
| 4,312,934 | 1/1982 | Rice et al. | 430/294 |
| 4,387,157 | 6/1983 | Bronstert et al. | 430/271 |
| 4,442,198 | 4/1984 | Tsao et al. | 430/311 |
| 4,528,261 | 7/1985 | Hauser | 430/322 |

Primary Examiner—John E. Kittle
Assistant Examiner—José D. Dees

[57] ABSTRACT

Use of a photoresist is improved due to increased adhesive to a substrate through an additive in the resist of a condensation polymer of formaldehyde, toluene sulfonamide and either a triazine such as melamine or hydantoin.

11 Claims, No Drawings

ADHESION PROMOTION IN PHOTORESIST LAMINATION AND PROCESSING

This invention relates to processes particularly useful for making printed circuit boards employing a solid, photosensitive layer employing an additive which functions to promote adhesion of the layer to a substrate.

Photosensitive compositions particularly useful as photoresists in making printed circuit boards are well known in the prior art. Conventionally these compositions are stored in roll form to minimize storage space. The photosensitive composition is adhered to a support film to form a two ply material such as disclosed in U.S. Pat. No. 4,293,635 or more conventionally in a three ply material such as U.S. Pat. No. 3,469,982 with the photosensitive composition sandwiched between a support film and a cover sheet. The material is unwound from a roll with the cover sheet if present, removed from contact with the photosensitive composition prior to use in lamination to a substrate, e.g., a copper surface. The laminated composition is imagewise exposed to actinic radiation with a support film stripped from the photosensitive composition before or after the exposure step. The unexposed areas of the starting light-sensitive layer are washed away to form a resist image of polymeric material. The areas of the substrate surface which are not protected by the remaining areas of laminated material are permanently modified by etching or by plating. Thereafter the photoresist is removed.

Various techniques have been disclosed to improve adhesion of the photosensitive layer to the substrate particularly since areas of such layer after exposure to actinic radiation must adhere to the substrate during processing steps such as etching of the substrate or by buildup of areas of the substrate by deposition of a conductor.

A photopolymerizable composition conventionally contains an adhesion promoter, i.e., an additive which aids in physically adhering the applied photopolymerizable layer in subsequent processing steps. Useful adhesive aids include monomeric or polymeric silanes and nitrogen containing heterocyclic compounds such as disclosed in U.S. Pat. No. 3,645,722 and U.S. Pat. No. 3,622,234.

The present invention allows elimination of conventional adhesion promoters in photosensitive compositions.

SUMMARY OF THE INVENTION

The present invention is directed to a process for forming a photoresist on a substrate comprising the steps of:
(a) laminating to the substrate a supported solid photosensitive film layer which is photopolymerizable or photocrosslinkable,
(b) imagewise exposing the layer to actinic radiation,
(c) removing unexposed areas of the layer to form resist areas,
(d) permanently modifying areas of the substrate which are unprotected by the resist areas by etching the substrate or by depositing a material onto the substrate, and
(e) removing the resist areas from the substrate, the photosensitive layer comprising:
(1) polymerizable or crosslinkable ethylenically unsaturated compound
(2) radiation sensitive, free radical generating photoinitiator or photoinitiator system and
(3) optionally binder,
wherein the improvement comprises the photosensitive layer containing an additive to increase adhesion to a substrate which is a condensation polymer formed from a triazine, formaldehyde and toluene sulfonamide or hydantoin, formaldehyde and toluene sulfonamide. A preferred triazine is melamine.

DETAILED DESCRIPTION OF THE INVENTION

The photosensitive composition useful as a photoresist contains conventional components of polymerizable ethylenically unsaturated monomer, photoinitiator or photoinitiator system which initiates polymerization of the photosensitive composition and binder.

The additive which imparts unique characteristics to the photosensitive composition is a condensation polymer of formaldehyde, toluene sulfonamide and either a triazine or hydantoin. Each of these polymers effectively function as an adhesion promoter. Mixtures of these polymers can be employed. Either all or a portion of prior art adhesion promoter can be replaced by the named condensation polymers. Examples of prior art adhesion promoters are described in Hurley et al., U.S. Pat. No. 3,622,334; Jones, U.S. Pat. No. 3,645,772; and Taguchi et al. U.S. Pat. No. 4,320,189.

The manner of formation of the condensation polymer of formaldehyde, toluene sulfonamide and either triazine or hydantoin can be in accordance with standard techniques in formation of such polymers as for instance described in McIntosh, U.S. Pat. No. 3,642,650, Switzer et al. U.S. Pat. No. 2,653,109, McIntosh et al. U.S. Pat. Nos. 3,412,034; 3,412,035, 3,412,036 and 3,412,104; and Kazenas U.S. Pat. Nos. 2,809,954 and 2,938,873, all incorporated herein by reference. Normally the starting material will be present in quantities which are near the stoichiometric ratios necessary to form the polymer. However one or two of the components can be present in excess in the polymerization step and such excess can be tolerated in the photosensitive composition. The condensation polymer has been employed as a component of a colorant but such use in adhesion promotion is not known for replacement of an adhesion promoter.

The concentration of the condensation polymer can vary within relatively wide limits based on the overall makeup of the monomer, photoinitiator and binder. Generally the condensation polymer will be present in a concentration of 0.5 to 25% by weight of the photosensitive layer and more typically 1 to 10% by weight and even more typically 2 to 6% by weight.

Although improved adhesion results have been obtained with the condensation polymer of formaldehyde, toluene sulfoamide and either triazine or hydantoin, an additional adhesion improvement has been obtained when the condensation polymer is formulated in the presence of a dye or a combination of dyes. Improved results have been obtained with dyes comprising Brilliant Green (C.I. 42040), Victoria Green (C.I. 42000) and Victoria Blue (C.I. 42595). Brilliant Green Dye is preferred.

In practicing the invention, photosensitive film resist elements of various types may be used. In general photohardenable, negative-working elements are photopolymerizable elements of the type disclosed in U.S. Pat. No. 3,469,982, U.S. Pat. No. 4,273,857 and U.S. Pat. No.

4,293,635 and the photocrosslinkable elements of the type disclosed in U.S. Pat. No. 3,526,504. In processing negative-working photoresist elements unexposed areas of the imaged element are typically removed from the surface of a printed circuit substrate by action of a developer liquid usually in a spray form for a duration of several minutes or less. Depending on the particular type of photoresist composition the developer liquid may be a simple organic solvent, an aqueous solution of an inorganic base, or, as in Alles U.S. Pat. No. 3,475,171, a combination of organic solvent and aqueous base to form a semi-aqueous developer liquid.

Suitable monomers which can be used as the sole monomer or in combination with others such as those in conventional photoresist include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain one or more free radical-initiated, chain-propagating, addition-polymerizable, ethylenically unsaturated compounds generally having a molecular weight of at least about 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Suitable binders which are polymeric when employed with polymerizable monomers can be used alone, or in combination with one another include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystryene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butandiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weight from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes. In place of or in addition to the polymeric binders listed above particulate thickeners with discrete, orderly orientation can be used such as disclosed in Kuchta U.S. Pat. No. 3,754,920, e.g., silicas, clays, alumina, bentonites, kalonites, etc.

In the case where aqueous development of the photoresist is desirable the binder should contain sufficient acidic or other groups to render the composition processible in aqueous developer. Useful aqueous-processible binders include those disclosed in U.S. Pat. No. 3,458,311 and in U.S. Pat. No. 4,273,856. Useful amphoteric polymers include interpolymers derived from an aminoalkyl acrylate or methacrylate, acidic film-forming comonomer and an alkyl or hydroxyalkyl acrylate such as those disclosed in U.S. Pat. No. 4,293,635. For aqueous development the photosensitive layer will be removed in portions which are not exposed to radiation but exposed portions will be substantially unaffected during development by a liquid such as wholly aqueous solutions containing 2% sodium carbonate by weight within the typical development duration of several minutes, e.g., two minutes.

Thermal polymerization inhibitors that can be used in the photosensitive compositions are: p-methoxy-phenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982. Normally a thermal polymerization inhibitor will be present to increase stability in storage of the photosensitive compositions.

Various dyes and pigments may be added to increase the visibility of the resist image. Any colorant used, however, should preferably be transparent to the actinic radiation used.

The following examples more fully illustrate the present invention. All parts and percentages are by weight and degrees are in centigrade unless otherwise indicated.

EXAMPLE 1

A "Master" coating solution was prepared having the following composition:

| Master 1 Composition | |
|---|---|
| Ingredient | Amount |
| Binder 1 Poly (methyl methacrylate/ methacrylic acid) (90/10): mixture of 7 parts of the polymer having a weight average M.W. of 25000 and 1 part of | 351 |
| the polymer having a weight average M.W. of 50,000 | |
| Trimethylol propane triacrylate | 226 |
| Benzophenone | 25 |
| Michler's ketone | 0.63 |
| Tricresyl phosphate | 12.5 |
| Triethylene glycol diacetate | 6.3 |
| Methylene chloride | 1128 |
| Methanol | 38 |

288 parts by weight of the solution was coated to a wet thickness of 0.006 in. (0.152 mm) on 0.001 in. (0.025 mm) polyethylene terephthalate film base and identified as coating A. To five additional 288 parts by weight aliquots of the solution the following amounts of adhesion promoters listed in Table I where added and coated as above:

TABLE I

| Component Added | Amount | Coating |
|---|---|---|
| None | — | A |
| Benzotriazole | 0.2 | B |
| HFS* | 5.0 | C |
| MFS** | 5.0 | D |
| MHP*** | 5.0 | E |
| Benzoguanamine | 0.2 | F |

*HFS is a condensation polymer of hydantoin, formaldehyde and mixed O & P toluene sulfonamide formulated with Brilliant Green (C.I. 42040) and C.I. Solvent Yellow 85.
**MFS is a condensation polymer of melamine, formaldehyde and mixed O & P toluene sulfonamide formulated with a red colorant.
***MHP is a toluene sulfonamide-formaldehyde plasticizing resin having a softening point of 62° C. and a specific gravity of 1.35 at 25° C. and also sold as Santolite ® MHP by the Monsanto Co.

Each coating after drying was laminated to a copper clad circuit board substrate which was scrubbed with an abrasive brush, using a Riston ® hot roll laminator. The laminated boards were imagewise exposed through a $6\sqrt{2}$ Stouffer 41 stepwedge using a Riston ®PC 24 exposure device and developed using a semi-aqueous developer containing 11% butyl Cellosolve ® and 1% borax. The time of exposure was adjusted to provide a similar number, about 20, of developed image steps.

Samples of each developed board were tested using standard plating and etching techniques.

PLATE AND ETCH PROCEDURE

Each board was immersed for 5 minutes in a 8.5% aqueous solution of Metex ®9268 preplate cleaner at 130° F. (54.4° C.), rinsed for 30 seconds in flowing water, immersed for 1 minute at room temperature in 10% aqueous sulfuric acid, immersed in flowing water for 1 minute, immersed in 18% aqueous ammonium persulfate solution, rinsed in water again, immersed in sulfuric acid once again for 1 minute and then immersed in acidic CuSO₄ plating solution and plated at 30 amps/sq. ft. (0.333 amps/sq. cm.) for 36 minutes to produce 0.001 in. (0.025 mm) plated copper.

The plated board was rinsed in water, is immersed for 1 minute in 20% aqueous fluoroboric acid solution, and then immersed in a commercial tin/lead (60/40) fluoroborate solution (Hi-Thro ®) and plated at 15 amps/sq. ft. (0.166 amps/sq. cm.) for 15 minutes to deposit 0.0004 in. (0.01 mm) solder on the copper plated image.

The board was rinsed with water and then the photopolymerized resist was stripped from the plated board using 92% methylene chloride/8% methanol solvent solution.

The stripped board was sprayed at 30 psi with an aqueous ammoniacal copper chloride solution (pH 7.8–8.2) (MacDermid Co. Ultra Etch ® Fine Line) for 1 minute at 130° F. (54.4° C.) to produce a solder plated copper circuit pattern.

ETCHING PROCEDURE

Each imaged and developed board was sprayed at 30 psi with an etchant solution at 130° F. (54.4° C.) until all unprotected copper was removed. In the instance when an alkaline etchant was used, MacDermid Ultra Etch ® Fine Line was the etchant. In the instance when acid etchant was used, sufficient cupric chloride and hydrochloric acid was used to produce an aqueous solution with a pH about 2.38 and containing 24 ounces of copper/gallon (177 g/l) of etchant.

EVALUATION OF PLATE AND ETCH BOARDS

Each board was examined with a 50 power optical microscope to determine if circuit line edges are "ragged" due to lifting of the edges of the resist with plating thereunder (known as "underplating"), or connected to adjoining circuit lines ("short" circuit) due to resist "blistering". Underplating and shorts indicate resist adhesion failure during the plating procedure resulting in resist delamination or blistering. The boards are also examined for the appearance of a bright ring or "halo" around circuit lines. The presence of halo while not a defect itself indicates the potential for underplating failure.

EVALUATION OF ETCHANT BOARDS

After boards were etched the resist is stripped as previously described and examined with the optical microscope to determine if circuit line edges are "ragged", i.e., contains "nicks" at the circuit line edges or if circuit line is "narrowed" indicating adhesion failure of the resist during etching. Gross failure leads to "breaks" or "opens" in the circuit line.

Table II contains the evaluation of the plated and etched boards and the alkaline and acid etched boards. In the table "NF" indicates no failure of adhesion was observed.

TABLE II

| Processing Procedure | Coated Board | | | | | |
|---|---|---|---|---|---|---|
| | A | B | C | D | E | F |
| Plate & etch | "ragged" "shorts" | NF | NF | NF | "ragged" | "ragged" "shorts" |
| Alkaline Etch | "ragged" | NF | NF | NF | "ragged" | "ragged" |
| Acid Etch | "ragged" "breaks" | NF | NF | "ragged" "breaks" | "ragged" "breaks" | "ragged" "breaks" |

Results indicate that the polymeric compounds added to the solvent coated film function at least as well as the conventional adhesion promoter for both the plate and etch procedure and the alkaline etch procedure. The hydantoin containing polymer also functioned satisfactorily for the acid etching procedure.

EXAMPLE 2

A solventless composition similar to coatings "B" and "D" of Example 1 were prepared having the following composition and were melt coated using the procedures described in Research Disclosure No. 24919 published January, 1985.

MASTER 2 COMPOSITION

| Ingredient | Amount |
|---|---|
| Binder 1 | 56 |
| Trimethylol propane triacrylate | 36 |
| Benzophenone | 4 |
| Michler's ketone | 0.1 |
| Tricresyl phosphate | 2 |
| Triethylene glycol diacetate | 1 |
| Crystal Violet | 0.04 |
| Red Dye CI 109 | 0.3 |

COATING COMPOSITION

| Component | G | H |
|---|---|---|
| Master 2 | 99.8 | 99.8 |
| Benzotriazole | .2 | .2 |
| MFS | — | 5.0 |

Each coating was processed and evaluated as in Example 1 and results are presented in Table III.

TABLE III

| Processing Procedure | Coated Board | |
|---|---|---|
| | G | H |
| Plate & Etch | NF | NF |
| Alkaline Etch | "Ragged" | NF |
| Acid Etch | "Breaks" "Massive Failure" | NF |

The above results demonstrate the advantage of using the adhesion promoters of this invention when compared to conventional adhesion promoters such as benzotriazole.

EXAMPLE 3

A master solution was prepared as in Example 1 except the binder component was adjusted for the amount of adhesion promoter added as indicated in Table IV. In Table IV Formulation X is a control since it contains no adhesion promoter.

MASTER 3 COMPOSITION

| Ingredient | Amount |
|---|---|
| Trimethylol propane triacrylate | 226 |
| Benzophenone | 25 |
| Michler's ketone | 0.63 |
| Tricresyl phosphate | 12.5 |
| Triethylene glycol diacetate | 6.3 |
| Methylene chloride | 1128 |
| Methanol | 38 |

TABLE IV

| Ingredient | Coating Composition | | | | | | |
|---|---|---|---|---|---|---|---|
| | X | I | J | K | L | M | N |
| Master 3 | 229 | 229 | 229 | 229 | 229 | 229 | 229 |
| Binder 1 | 55.2 | 54.7 | 53.2 | 52.2 | 51.2 | 50.2 | 49.2 |
| HFS | 0 | .5 | 1.0 | 2.0 | 3.0 | 4.0 | 5.0 |

Each solution was coated, processed and evaluated as in Example 1. In addition, the adhesion of photoresist to copper prior to exposure was measured by removing the polyethylene terephthalate support and adhering 1 inch (2.54 cm) wide Scotch ® brand masking tape 2262MSR to the resist surface. One end of the tape was attached to an Instron ® Universal Testing Instrument model 1130 and peeled at a 180° direction at 5 inches/min (12.7 cm/min) from the board substrate surface. The force needed to separate the resist from the copper surface was identified as the "Copper Adhesion" and represented as the number of grams per linear cm. In addition the plate and etch and alkaline etching evaluations were quantified by identifying the number of defects for a test board having 125 lines 0.007 in. (0.178 mm) with an equivalent number and size spaces therebetween. For example in the instance where no HFS adhesion promoter was used (Coating X), the adhesion to copper prior to exposure was measured to be 13.4 g per linear cm. The test board after alkaline etching had 3 Breaks and 8 Nicks with resist lifting and peeling and a similar board after plating had Halos, Lifting and Shorts. The results for the coatings at the increasing concentration are presented in Table V where "NF" indicates no failure, "H" indicates presence of halos, "L" indicates Lifting, "S" indicates Shorts, "B" indicates Breaks, "N" indicates Nicks and copper adhesion is given in g/cm.

TABLE V

| Ingredient | X | I | J | K | L | M | N |
|---|---|---|---|---|---|---|---|
| Plate and Etch | H,L,S | NF | NF | NF | NF | NF | NF |
| Alkaline Etch | 3B+ 8N | 1B | 9B+ 2N | 4B+ 2N | 1B+ LN | 1B | NF |
| Copper Adhesion | 13.4 | 18.9 | 18.9 | 18.9 | 26.6 | 27.6 | 52.6 |

As little as 0.5% by weight of the polymeric adhesion promoter is sufficient to improve performance during plate and etch processing and overall performance is improved with about 4% of the adhesion promoter.

EXAMPLE 4

Six additional coatings were prepared and processed and evaluated as in Example 3 except that adhesion promoter MFS was used in place of HFS.

TABLE VI

| | Coating Composition | | | | | |
|---|---|---|---|---|---|---|
| Ingredient | O | P | Q | R | S | T |
| Master 3 | 229 | 229 | 229 | 229 | 229 | 229 |
| Binder 1 | 54.7 | 53.2 | 52.2 | 51.2 | 50.2 | 49.2 |
| MFS | .5 | 1 | 2 | 3 | 4 | 5 |

The quantified results below in Table VII indicate that improvement of all functions begins with around 3% of this adhesion promoter and rises rapidly to optimum performance by about 5%.

TABLE VII

| Ingredient | X | O | P | Q | R | S | T |
|---|---|---|---|---|---|---|---|
| Plate and Etch | H,L,S | H&L | H&L | H* | H** | NF | NF |
| Alkaline Etch | 3B+ 8N | 1B | 6B | 10B | 4B | 1N | NF |
| Copper Adhesion | 13.4 | 13.4 | 16.2 | 16.2 | 21.5 | 25.8 | 26.8 |

*slight
**very slight

Results of the tests in Examples 3 and 4 indicate that addition of either HFS or MFS improves adhesion performance of the laminated solvent coated resist films either in the plate and etch mode or the alkaline etch mode or both.

EXAMPLE 5

Two solvent processable 0.002 inch thick photoresist films were prepared from the following coating solutions:

| Component | Coating U | Coating V |
|---|---|---|
| Poly(methylmethacrylate/ethylmethacrylate) (75/25) inherent viscosity 0.49 | 56 | 56 |
| Trimethylol propane ethoxylated triacrylate, M.W. 400 ± 50 | 30.9 | 30.9 |
| Ethyl Michler's ketone | 0.15 | 0.15 |
| Benzophenone | 4 | 4 |
| 4-Methyl-4-trichloromethyl cyclohexadiene-1-one | 0.06 | 0.06 |
| p-Toluene sulfonic acid | 0.05 | 0.05 |
| Leuco Crystal Violet | 0.25 | 0.25 |
| Victoria Green Dye (C.I. 42000) | 0.04 | 0.04 |
| Victoria Blue Dye (C.I. 42595) | 0.02 | 0.02 |
| HFS-UP** | 4 | — |
| Santicizer ®9 (mixed o and p toluene sulfonamide) | 4.53 | — |
| MHP*** | — | 8.53 |
| Propylene glycol methyl ether | 11 | 11 |
| Methylene Chloride | 175 | 175 |

*Trimethylolpropane ethoxylated triacrylate (TMPEOTA) has the following ethoxylate distribution which constitutes a minimum of 92% of the distribution
None 6% Max
Monoethoxy 10-20%
Diethoxy-1 12-18%
Diethoxy-2 14-21%
Triethoxy-1 21-29%
Triethoxy-2 6-10%
Tetraethoxy 12-20%
**HFS-UP is an unpigmented condensation polymer of hydantoin, formaldehyde and mixed o and p toluene sulfonamide formulated with phthalic anhydride.
***MHP is a toluene sulfonamide-formaldehyde plasticizing resin having a softening point of 62° C. and a specific gravity of 1.35 at 25° C. and is purchased as Santolite ® MHP from the Monsanto Co.

Each solution was coated on a 0.001 inch thick polyethylene terephthalate support film to give a dry coating thickness of 0.002 inch.

Each dried coated resist film was laminated to three copper clad substrates which were scrubbed with an abrasive brush using a Riston ® hot roll laminator. Each laminated board was imagewise exposed through a 6√2 Stouffer ®41 stepwedge using a Riston ®PC 24 exposure device and devloped in a Riston ®C Processor (at 60° to 70° F. with 20 psi spray pressure) containing stabilized 1,1,1 trichloroethane as the developer solvent.

Each of the developed boards were tested using the following rigorous plating and etching technique.

PLATE AND ETCH PROCEDURE

Each board was immersed for 5 minutes in a 8.5% aqueous solution of Metex ®9268 preplate cleaner at 130° F. (54.4° C.), rinsed for 1 min in flowing water, immersed in 18% aqueous ammonium persulfate solution for 1 min or less to remove 10–15μ inch copper, rinsed in water again, immersed in sulfuric acid for 1 minute and then immersed in alkaline copper pyrophosphate heating plating solution and plated at 20 amps/sq. ft. for 54 minutes to produce 0.001 inch (0.0025 cm) plated copper.

The plated board was rinsed in water, immersed for 30 seconds in 20% aqueous fluoroboric acid solution, and then immersed in a commercial tin/lead (60/40) fluoroborate solution (Hi-Thro ®) and plated at 20 amps/sq. ft. (0.1667 amps/sq. cm.) for 12 minutes to deposit 0.0005 inch (0.01 mm) solder on the copper plated image.

The board was rinsed with water and then the photopolymerized resist was stripped from the plated board using methylene chloride solvent.

The stripped board was sprayed at 20 psi with an aqueous ammoniacal copper chloride solution (pH 7.8–8.2) (MacDermid Co., Ultra Etch ® Fine Line) at 130° F. (54.4° C.) to produce a solder plated copper circuit pattern.

For each of the plated and etched boards in which MHP was used in the resist formulation copper staining occurred during the process which is a defect indicating the potential for underplating. In contrast no defects were observed for the plated and etched boards which were prepared from the resist film containing HFS-UP.

The plated board was rinsed in water, is immersed for 1 minute in 20% aqueous fluoroboric acid solution, and then immersed in a commercial tin/lead (60/40) fluoroborate solution (Hi-Thro ®) and plated at 15 amps/sq. ft. (0.166 amps/sq. cm) for 15 minutes to deposit 0.0004 in (0.01 mm) solder on the copper plated image.

The board was rinsed with water and then the photopolymerized resist was stripped from the plated board using 92% methylene chloride/8% methanol solvent solution.

The stripped board was sprayed at 30 psi with an aqueous ammoniacal copper chloride solution (pH 7.8–8.2) (MacDermid Co. Ultra Etch ® Fine Line) for 1 minute at 130° F. (54.4° C.) to produce a solder plated copper circuit pattern.

EXAMPLE 6

Four solvent processable 0.002 in thick photoresist films were prepared and tested for use under very rigorous plating and etching conditions.

A Master coating solution was prepared for each coating having the following Composition:

| Master 4 Composition | |
|---|---|
| Ingredient | Amount in grams |
| Poly(methylmethacrylate/ ethylmethacrylate) (75/25) inherent viscosity 0.49 | 728 |
| Trimethylol propane ethoxylated triacrylate, M.W. 400 ± 50 | 401.7 |
| Ethyl Michler's ketone | 1.95 |
| Benzophenone | 52.05 |
| 4-Methyl-4-trichloromethyl cyclohexadiene-1-one | 1.30 |
| Tris-(4-diethylamino-2-tolyl) methane | 1.95 |
| Leuco Crystal Violet | 3.25 |
| Santicizer ®9 (mixed o and p toluene sulfonamide) | 55.69 |
| p-Toluene sulfuric acid | 0.65 |
| 5-Chlorobenzotriazole | 2.60 |
| Propylene glycol methyl ether | 142.58 |
| Methylene chloride | 2274.07 |

Coating Solution "W" contained the ingredients of Master solution 4 along with 0.52 g of Victoria Green Dye; 0.39 g Victoria Blue Dye and 50.1 g of HFS-UP of Example 5.

Coating Solution "X" contained the ingredients of Master solution 4 along with 51.01 g of HFS-BG which is the condensation polymer of hydantoin, formaldehyde and mixed o and p toluene sulfonamide formulated with 1% Brilliant Green Dye (C.I. 42040).

Coating Solution "Y" contains the ingredients of Master Solution 4 along with 51.01 g of HFS-BGVB which is the condensation polymer of hydantoin, formaldehyde and mixed o and p toluene sulfonamide, formulated with 1% Brilliant Green Dye (C.I. 42040) and 0.76% Victoria Blue Dye (C.I. 42595).

Coating solution "Z" contains the ingredients of Master Solution 4 along with 51.01 g of HFS-VGVB which is the condensation polymer of hydantoin, formaldehyde and mixed o and p toluene sulfonamide, formulated with 1% Victoria Green Dye (C.I. 42000) and 0.8% Victoria Blue Dye (C.I. 42595).

These coating solutions were coated, laminated exposed and developed as in Example 5 and then tested using the copper/tin-lead plating and etching procedure of Example 5 along with a conventional copper/nickel/gold plating procedure. In this plating procedure the copper is plated as in Example 5 the plated panel is rinsed in water for 1 minute and then nickel plated in an acidic nickel sulfamate solution using a current density of 30 ampers/square feet for 15 minutes to produce nickel plating 0.0003 inch thick. The nickel plated panel is then rinsed and immersed in a 10% aqueous sulfuric acid both for 1 minute, rinsed again and then gold plted in a Orosene ®999 gold plating bath at 83° F. for 10 minutes at a current density of 10 ampers/square foot. In evaluating the results of these tests a series of circuit board panels are processed for each coating and each panel is given a numerical value from 0 to 5 depending on whether the panel has no defects, e.g., "O", nonfunctional defects, e.g. 1, 2 and 3 (such as copper staining) which still produce acceptable circuit board or functional defects, e.g., 4 and 5, such as underplating and shorts which disqualify the board for use. The average value for each series of panels for each type of plating is given in Table VIII for each coating.

TABLE VIII

| Coating | Cu/Sn-Pb | Cu/Ni/Au |
|---|---|---|
| W(HFS-UP) | 3.3 | 4.2 |
| X(HFS-BG) | 2.0 | 2.25 |
| Y(HFS-BGVB) | 1.3 | 0.8 |
| Z(HFS-VGVB) | 3 | 3.1 |

While acceptable boards can be obtained from all of the coatings using Cu/Sn-Pb plating it is clear that best results are obtained using condensation polymers formulated in the presence of Brilliant Green Dye and some improvement is obtained with polymers formulated in the presence of Victoria Blue and/or Victoria Green. This same trend of improvement is also present for panels prepared under the more severe conditions of Cu/Ni/Au plating.

What is claimed is:

1. In a process for forming a photoresist on a substrate comprising the steps of:
   (a) laminating to the substrate a supported solid photosensitive film layer which is photopolymerizable of photocrosslinkable,
   (b) imagewise exposing the layer to actinic radiation,
   (c) removing unexposed areas of the layer to form resist areas,
   (d) permanently modifying areas of the substrate which are unprotected by the resist areas by etching the substrate or by depositing a material onto the substrate, and (e) removing the resist areas from the substrate, the photosensitive layer comprising:
  (1) polymerizable or crosslinkable ethylenically unsaturated compound, and
  (2) radiation sensitive, free radical generating photoinitiator or photoinitiator system,
  wherein the improvement comrprises the photosensitive layer containing an additive to increase adhesion to a substrate which is a condensation polymer formed from a triazine, formaldehyde and toluene sulfonamide or hydantoin, formaldehyde and toluene sulfonamide.

2. The process of claim 1 wherein the condensation polymer is formed from a triazine, formaldehyde and toluene sulfonamide.

3. The process of claim 1 wherein the triazine is melamine.

4. The process of claim 1 wherein the condensation polymer is formed from hydantoin, formaldehyde and toluene sulfonamide.

5. The process of claim 1 wherein the condensation polymer is present in a concentration in a range from 0.5 to 25% by weight of the photosensitive layer.

6. The process of claim 5 wherein the concentration is in a range from 1 to 10% by weight of the photosensitive layer.

7. The process of claim 5 wherein the concentration is in a range from 2 to 6% by weight of the photosensitive layer.

8. The process of claim 1 wherein binder is present in the photosensitive layer.

9. The process of claim 1 wherein binder is absent in the photosensitive layer.

10. The process of claim 1 wherein the condensation polymer is formulated in the presence of a dye comprising Brilliant Green (C.I. 42040), Victoria Green (C.I. 42000) and Victoria Blue.

11. The process of claim 10 wherein the dye is Brilliant Green (C.I. 42040).

* * * * *